Sept. 14, 1965 M. M. ATALLA 3,206,670

SEMICONDUCTOR DEVICES HAVING DIELECTRIC COATINGS

Filed March 8, 1960

INVENTOR
M. M. ATALLA
BY
ATTORNEY

United States Patent Office 3,206,670

Patented Sept. 14, 1965

3,206,670 SEMICONDUCTOR DEVICES HAVING DIELECTRIC COATINGS

Martin M. Atalla, Mountainside, N.J., assignor to Bell Telephone Laboratories, Incorporated, New York, N.Y., a corporation of New York Filed Mar. 8, 1960, Ser. No. 13,688
6 Claims. (Cl. 323—93)

This invention relates to semiconductor devices which utilize the properties of thermally grown oxide coatings as a basis of operation.

One object of this invention is a high frequency variable capacitor.

Another object of this invention is a high frequency switch.

In its basic form, the invention comprises a silicon wafer which includes a PN junction typically intersecting at least one surface of the wafer and a thermally grown oxide coating over the region of intersection with such surface. By providing an electrode to the exposed surface of the oxide to which a voltage is applied, the underlying region of the wafer can be affected to achieve desirable changes in signals impressed between other electrode connections to the wafer.

The various classes of devices to be described owe their different electrical characteristics to the specific configuration of the semiconductor material employed and the various geometric arrangements of the contacts, the one or more rectifying junctions, the oxide, the electronic properties of the silicon-silicon oxide interface as well as the voltages applied.

In particular, it has been found necessary to limit the thickness of the oxide coating to less than 500 angstroms, typically 100 angstroms, to obtain the high frequency capacitance variations described herein. It has also been found advantageous to electrically neutralize or passivate the underlying semiconductor surface.

Patent No. 2,899,344, issued August 11, 1959, to M. M. Atalla, E. J. Scheibner and E. Tannenbaum discloses a specific method for passivating silicon semiconductor wafers which includes a step of thermally oxidizing the surfaces of the wafer by heating in an oxidizing atmosphere. Additionally, copending application Serial No. 790,848 of J. R. Ligenza, filed February 3, 1959, now Patent No. 2,930,722, discloses an alternative to the above process wherein the step of thermally oxidizing the wafer comprises an oxidation treatment of the wafer in steam.

The methods in accordance with the above references provide a suitable oxide coating for the accomplishment of this invention. Therefore, the invention will be described in terms of the oxides which result from these methods. The oxide, formed in accordance with the teachings of the cited references, will be referred to hereinafter simply as an oxide coating.

Copending application Serial No. 819,923 of C. G. B. Garret and W. G. Pfann, filed June 12, 1959, now Patent No. 3,094,671, additionally discloses considerations particularly pertinent to this invention.

For example, when an oxide coating is provided on a surface of a silicon wafter and a voltage applied across the oxide, a charge of a particular polarity appears on the surface of the oxide, a charge of the opposite polarity is induced in the surface region of the underlying semiconductor wafer and a capacitor results. The induced charge results from the accumulation or depletion of the appropriate charge carriers from the body of the semiconductor wafer. As an illustration, when the underlying semiconductor material is of P-type conductivity, the majority carriers are holes or positive charge carriers. In response to a negative charge on the surface of the oxide, these majority carriers accumulate in the surface of the wafer adjacent the oxide. As the negative charge increases so does the positive charge. This results in an increase in capacitance with increased voltage.

Similarly, with such a wafer in response to a positive charge on the surface of the oxide, minority carriers are accumulated at and majority carriers are depleted from the surface region of the wafer and again capacitance increases with voltage. However, if high frequency signals are employed in this latter instance the relatively slow generation and recombination of minority carriers limits the accumulation of minority carriers and capacitance in the positive half of a cycle actually continues to decrease instead.

One object of the invention is a voltage variable capacitor in which the capacitance variation can follow high frequency voltage variations.

The invention and the various objects and features thereof will be understood more clearly and fully from the following detailed description rendered with reference to the accompanying drawings, in which.

It is to be understood that the drawings are for illustrative purposes only and, therefore, not necessarily to scale.

Figure 1:
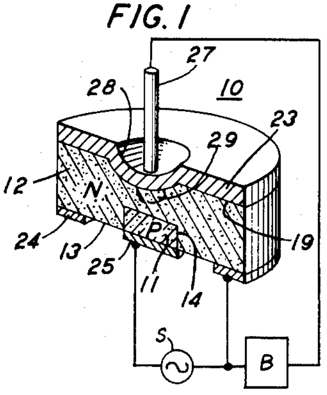
FIGS. 1, 2 and 4 are perspective views, partially in cross-section of embodiments of this invention operating as variable capacitors.

In FIG. 1, the major portion 12 of device 10 is a disk shaped body of N-type semiconductor material. Minority carrier source 11, typically a forward biased P-type emitter, is connected to a major surface 13 of portion 12 in accordance with techniques well known in the art and specifically described, for example, in Patent No. 2,695,852, issued November 30, 1954, to M. Sparks. PN junction 14 appears along the interface between the P and N-type conductivity region. The opposing major surface 19 of the major portion 12 is shown dimpled over a minor area of the surface to reduce the cross sectional area of portion 12 proximate the minority carrier source 11. Oxide coating 23 is grown on this dimpled surface 19 and assumes the contour of the surface. Electrode 24 is a washer-shaped substantially ohmic contact deposited on the surface 13 opposite the oxide coating and substantially ohmic contact 25 is connected to the minority carrier source 11. Lead 26 is connected to oxide coating 23 at the dimple.

In response to a voltage impressed by way of a battery B connected between electrode 24 and lead 27 of polarity corresponding to an accumulation of negative charges on the surface 28 of the oxide, positive charges are accumulated in an area of the major portion 12 contiguous to the oxide coating 23 and beneath the lead 27. This region is designated by numeral 29. The proximity of region 29 to minority carrier source 11 provides the necessary minority carriers for rapid fluctuation of capacitance in response to high frequency voltage fluctuations applied by way of signal source S connected between electrodes 24 and 25. The capacitance variation is observed across electrodes 24 and 27.

Figure 2:
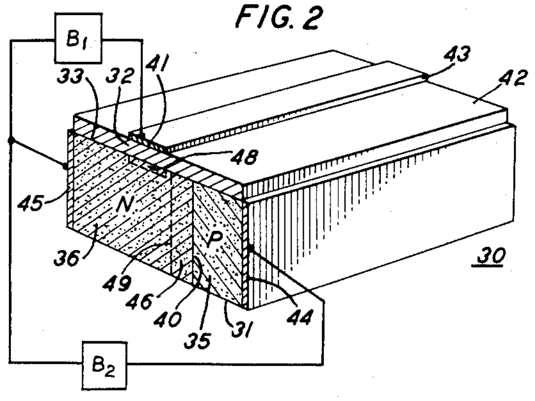

In FIG. 2, device 30 is shown comprising a semiconductor wafer 31 and a thermally grown oxide coating 32 on a surface of the wafer defining a mutual interface 33. Wafer 31 compises two regions 35 and 36 of P and N-type conductivity defining a PN junction 40 therebetween. Junction 40 typically is in a plane substantially perpendicular to the plane of oxide coating 32. A contact 41 is connected to the surface 42 of oxide coating 32 in a position spatially removed from the extension of the plane of the junction through the oxide coating. The face 43 of contact 41 is in a plane parallel to the plane of PN junction 40. Therefore, the contact 41 does not intersect the plane of PN junction 40. Ohmic contacts 44 and 45 are connected to the P and N-type conductivity regions 35 and 36, respectively. A space charge region 46 is shown extending into N region 36 from the PN junction 40 and bounded by plane 49. Region 48 shown at the interface 33 between the oxide coating 32 and the wafer 31 extends along the interface beneath the electrode 41.

In operation, the region 48 includes charge carriers accumulated in response to a voltage applied by way of a battery $B_1$ connected between contacts 41 and 45. If this voltage corresponds to an accumulation of negative charges at metallic contact 41 on the surface 42 of the oxide coating 32, positive charges will be accumulated in region 48 and a capacitance will be observed between contacts 41 and 45. A voltage applied by way of a second battery $B_2$ connected between contacts 44 and 45 corresponding to a reverse bias across junction 40 will extend the space charge region 46 further into N-type conductivity region 36. As this voltage increases the space charge region 46 will limit the availability of charges in region 48 and the capacitance will decrease.

At a critical value of reverse bias the junction will be characterized by the onset of avalanche breakdown. At this voltage value, the device will be further characterized by a rapid increase in capacitance in response to increasing reverse bias across the junction. This increase in capacitance is occasioned by the increased availability of charge carriers due to avalanche breakdown. The latter feature is not usually incorporated into the normal operation of the device, the contact to the oxide coating typically being restricted to the dimensions well within the range of normal space charge expansion and contraction.

Figure 3:
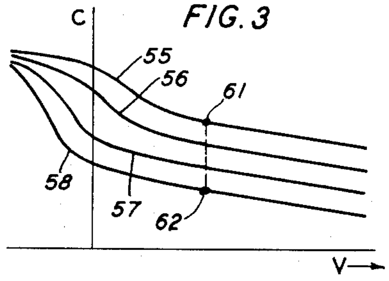
FIG. 3 is a graph showing the capacitance versus voltage characteristic of the device shown in FIG. 2.

FIG. 3 illustrates the family of capacitance versus voltage curves for the normal operation of the device of FIG. 2. The ordinate is the capacitance observed between electrodes 41 and 45 and the abscissa is the reverse voltage applied between electrodes 44 and 45. The curves 55, 56, 57, and 58 correspond respectively to different increasing values of reverse bias across the PN junction and depict the decrease in capacitance as the bias across the oxide is changed. The operation of the device can be appreciated by considering the change in capacitance from point 61 to 62 which results by varying the PN junction bias from a value corresponding to curve 55 to a higher value corresponding to curve 58.

Figure 4:
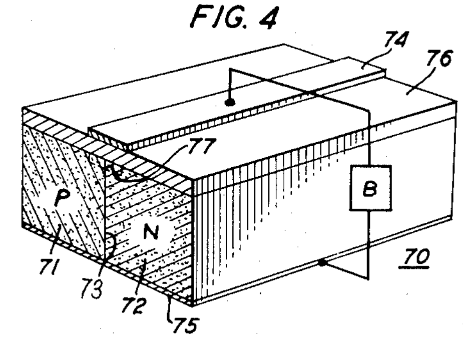

FIG. 4 depicts a device 70 which is characterized by a capacitance-voltage characteristic having a minimum. The device includes two regions 71 and 72 of P and N-type conductivity respectively and a PN junction 73 therebetween. The device is similar to the device described in relation to FIG. 2 except contact 74 to oxide coating 76 intersects the extension of PN junction 73 through the oxide coating. Additionally, only one contact 75 is connetced equally to both P and N-type conductivity regions. A bias of either polarity introduced by way of a battery B connected between contact 74 to the oxide coating 76 and contact 75 will occasion an accumulation of oppositely charged particles in region 77. The resulting capacitance will increase with increasing bias of either polarity. This characteristic differs from that described above in relation to the Garrett-Pfann reference in that the capacitance variations produce a minimum even at high frequency voltage variations.

Figures 5, 6, 7:
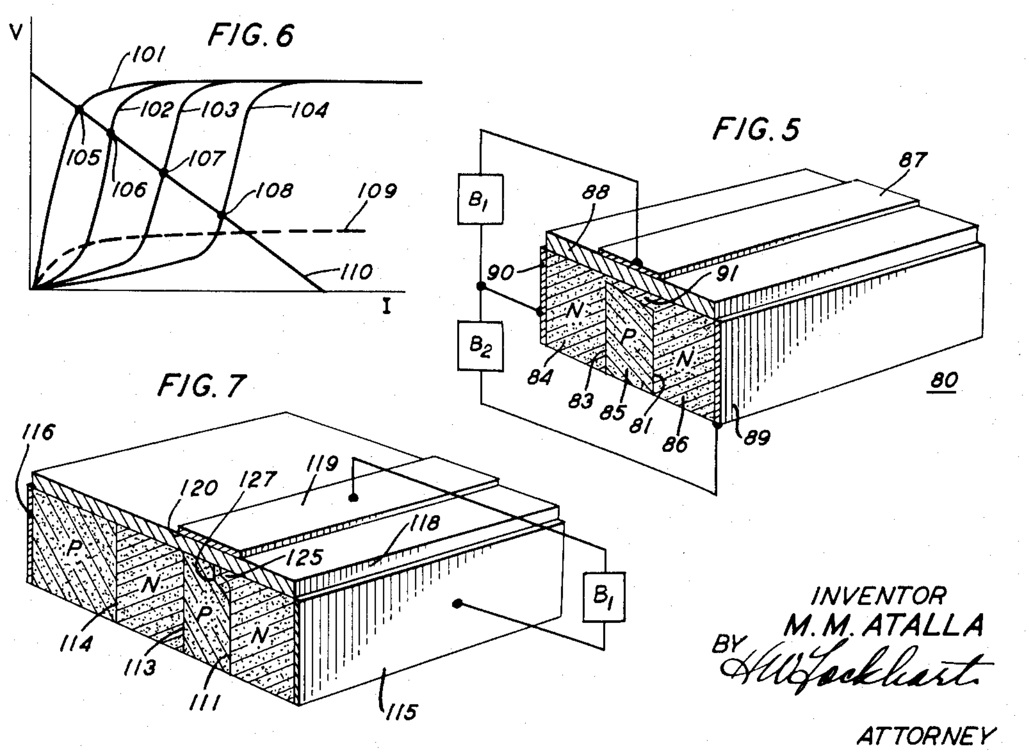
FIGS. 5 and 7 are perspective, partially in cross-section views of embodiments of this invention which utilize an induced conductivity region beneath the oxide to provide a low impedance current path through a high impedance device.
FIG. 6 is a graph illustrating one mode of the operation of the device shown in FIG. 5.

The device 80 of FIG. 5 is structurally similar to the device of FIG. 4. However, inclusion of an additional PN junction 81 substantially parallel to the single junction 83 as depicted in FIG. 4 results in an NPN configuration corresponding to regions 84, 85 and 86 as shown. Additionally, individual ohmic contacts are provided to each of the two N regions 84 and 86. For the particular arrangement of conductivity type regions 84, 85, and 86 shown, a bias of positive to negative polarity in applied by way of a battery $B_1$ connected between contact 87 to the oxide coating 88 and contact 90 respectively. Contact 87 extends across the extensions through the oxide of the planes of the two PN junctions 81 and 83.

If, for example, junction 81 is biased in the forward direction and junction 83 is biased in the reverse direction by the application of an appropriate voltage from a battery $B_2$ connected between ohmic contacts 89 and 90, a positive bias at the oxide will induce a region of negative charge 91 which will provide a low impedance path at a predetermined value of bias applied across the oxide layer. The device can be returned to its high impedance state by removing the bias or, alternatively, by application of a negative voltage at the oxide depending on design parameters.

The operation of the device as a switch is evident from the above description. However, the device may be used alternately as an amplifier, for example, with reference to FIG. 6, current I is plotted against voltage across a resistive load connected betwee contacts 89 and 90. Curve 101 is the output voltage-current characteristic for the bias $V_0$ applied across the oxide layer equal to a value in the range from $V_0=0$ to $V_0=V_c$ where $V_c$ is the critical value necessary to provide a low impedance path. Curve 102 is the characteristic for $V_0=V_c+\Delta$ where $\Delta$ is any increment in $V_0$. Curves 103 and 104 are the characteristics for increasingly higher increments of voltage. Points 105, 106, 107 and 108 are attained by changing the bias $V_0$ applied across the oxide layer, assuming a resistive load represented by the load line 110. Dotted line 109 indicates the voltage along the element for which each indicated $V_0$ will cause a pinch off of the current as will be explained below. Further uses of this device are obtained by adding an additional ohmic contact to the P region.

FIG. 7 depicts a device physically similar to the device of FIG. 5 with a third junction 114 arranged substantially parallel to junctions 111 and 113. The two ohmic contacts 115 and 116 are at opposing ends of the laminar PNPN semiconductor body 117. Oxide coating 118 extends over one entire surface of body 117 in a plane substantially perpendicular to the planes of the PN junctions 111, 113, and 114. Contact 119 extends along the surface 120 of the oxide coating over extensions of the planes of the PN junctions 111 and 113 through the oxide. Considering both junctions 111 and 114 as emitting junctions and junction 113 as the collecting junction, the resulting current $$I=\frac{I_s}{1-(\alpha_{114}+\alpha_{111})M}$$

where $I_s$ is the reverse saturation current of junction 113 and $\alpha_{111}$ and $\alpha_{114}$ represent the fraction of minority carriers emitted from junctions 111 and 114 respectively, which reach junction 113 and M is the multiplication factor of the collector junction 113. It can be seen from the equation that when $$(\alpha_{111}+\alpha_{114})M=1,\ I=\frac{I_s}{1-1}=\frac{I_s}{0}$$

and the device becomes a low impedance device or switches on.

Control over $\alpha_{111}$ is afforded in the following manner: For the configuration of conductivity regions shown, a voltage is applied by way of a battery $B_1$ connected between contact 119 to oxide coating 118 and contact 115 to the semiconductor wafer in order to bias the oxide coating positively. This induces negatively charged region 125 which enlarges as indicated by curve 127 as a bias of positive polarity applied to contact 119 is increased.

This effectively decreases the distance between junctions 111 and 114, which in turn increases the minority carriers arriving at junction 113. The result is a controllably increased $\alpha_{111}$.

Advantageously, a second oxide coating and contact can be attached to the surface of the semiconductor wafer disposed in relation to junctions 111 and 113 or in relation to junctions 114 and 113 in the manner illustrated.

The electrical properties of the devices described are particularly sensitive to the relationship between the active constituents of the device as has been shown. These properties are also sensitive to the method of fabrication. The considerations involved are conveniently described in terms of particular devices. However, it is to be understood that these considerations have application to the other devices described.

More specifically, the fabrication of the devices described is accomplished by methods well known in the art. However, in the devices of FIGS. 4, 5, and 7 in particular the method of fabrication determines some interesting features.

For example, with reference to the device of FIG. 5, if the conductivity regions are formed in accordance with vapor-solid diffusion techniques the regions will have graded impurity concentration. Referring specifically to the center conductivity region directly under the contact to the oxide as shown in FIG. 5, the depth to which the induced region penetrates will be greater where the P-type impurity concentration is smaller. This penetration is least at the center of the P region shown in the figure and increases toward the junctions substantially in planes parallel to the junctions, in contrast to a uniform depth of penetration of an ungraded P region. Therefore, for biases across the oxide layer of less than $V_c$, two induced charge regions will exist.

In operation this device has one junction biased forward and one biased in the reverse direction. The induced charge region proximate to the forward biased junction will provide the significant action of the device.

FIG. 7 shows the typical geometry of the induced conductivity region in a device fabricated by vapor solid diffusion techniques. However, the induced charge region is of uniform depth if other methods of fabrication were employed.

Additionally, the extent of the oxide coating is of some interest. The minimum length of the oxide coating equals the length of the contact to the oxide coating which must extend over the two PN junctions as shown, for example, in FIG. 5. However, if the contact to the oxide coating is formed over the entire surface of the device shown in FIG. 5, the conductivity of the wafer measured between contacts 89 and 90 will rise sharply not only as the value of bias across the oxide increases positively from the critical value but also as the value of bias increases negatively beyond a critical value determined by impurity concentration of regions 84 and 86.

The critical voltage value $V_c$ corresponds to the bias across the oxide layer necessary to change the surface potential from its initial value to its value at the onset of inversion, for example, a surface potential value when a negatively charged region is induced in the surface of a P-type conductivity region. This voltage $V_c$ is related to the necessary charge by the equation $C_0V_c=Q_0$ where $C_0$ is the capacitance of the oxide coating in farads and $Q_0$ is the charge in coulombs. The number of charge carriers $N_p$ on the surface of the oxide is obtained by dividing $Q_0$ by $q$, the charge, in coulombs, on one charge carrier.

For a given impurity concentration the number of charges in the space charge at the onset of inversion is given by $$N_{sc}=N_iL\left[\lambda(e^{-U_b}-1)+\frac{1}{\lambda}(e^{U_b}-1)+\left(\lambda-\frac{1}{\lambda}\right)U_b\right]^{1/2}$$

where L equals the Debye length for the semiconductor, $$\lambda=\frac{P_0}{N_i}$$

where $P_0$ equals the hole density in the body of the wafer and $N_i$ equals the intrinsic density, and $U_b=ln\lambda$. Therefore, for any resistivity material, the charge on the oxide $N_p$ will just bring about the onset of inversion if $N_p=N_{sc}$. For lower resistivity more charge is needed across the oxide to attain this onset of inversion. This discussion is considered in detail in the Bell System Technical Journal, vol. 38, pages 749–784, May 1959, by M. M. Atalla, E. Tannenbaum and E. J. Scheibner entitled "Stabilization of Silicon Surfaces by Thermally Grown Oxides."

If contact 75 is removed from the device shown in FIG. 4 and a single ohmic contact is connected to both sides of the PN junction, the device has application as a switch or, alternatively, as an amplifier. Additionally, this arrangement has the interesting advantage that the voltage at which the junction breaks down is responsive to the bias across the oxide layer.

Considering the device of FIG. 5, the effect of the voltages across the junctions is of particular importance. Taking a specific example, suppose junction 81 is forward biased at some negligible value which is effectively zero, junction 83 is reverse biased at 5 volts and the oxide is biased at 10 volts. If the critical bias voltage $V_c$ across the oxide layer is 2 volts and the impurity concentration through the P region is uniform, the total voltage drop in the body of the device will appear across the space charge region of junction 83. Therefore, the depth of the induced region will correspond to 5 volts to the right of junction 83 and 10 volts to the left of junction 81 with a gradual change between the two points as is indicated in the figure. If the voltage across the oxide is reduced to 7 volts, the depth of the induced region at junction 83 will be 2 volts. Any further decrease results in a complete closing of this path which is called pinch-off since it will allow no further increase in current with increasing voltage between electrodes 89 and 90.

The pinch-off points are plotted on the graph of FIG. 6 and broken curve 109 is drawn therethrough. This line 109 effectively divides the graph into two areas, one above and one below the pinch-off line. This line 109 similarly denotes two modes of operation of the device, the area above the line representing the operation of the device at essentially constant current characteristics, the area under the line representing the operation in the region of essentially ohmic characteristics.

A device as shown in FIG. 5 can be made from a slice of P-type conductivity semiconductor material, typically a slice of silicon containing a uniform distribution of boron therein. For example, the silicon can suitably include a boron concentration of from $10^{19}$ atoms/cc. to less than $10^{12}$ atoms/cc. However, the bias across the oxide will be affected as described above. Typically the resistivity of the slice is one ohm centimeter. Phosphorus is diffused into both sides of the slice in accordance with vapor-solid diffusion techniques. Alternatively, boron and phosphorus are diffused into one side of a slice of silicon of N-type conductivity. This latter method is one means for providing the impurity concentration gradient necessary for the operation of the device in the preinversion region as noted above. The device is then divided into wafers by well known techniques and cleaned in accordance with the teachings of the Atalla patent noted above. The wafers are thereafter thermally oxidized in a suitable oxidizing atmosphere.

This oxidation treatment, typically carried out in steam, will form an oxide over the entire wafer which can be removed selectively by well known means. This oxide will range in thickness from 100 A. to greater than 3000 A.

A suitable contact of conductive metal such as aluminum, gold or silver is deposited on the oxide in an area at least encompassing extensions through the oxide of the planes in which the underlying PN junctions lie. Ohmic contacts are then attached to the ends of the device as indicated.

The cut-off frequency of the device $$f_{co}=\frac{1}{2\pi RC_0}$$

where R equals the resistance of the path traversed by the collected carriers and $C_0$ is the equivalent capacitance of the oxide coating and the junctions. The calculations for operative devices yield a cut-off frequency typically greater than $3\times10^8$ cycles per second.

A device of the type described in relation to FIG. 5 was fabricated in the following manner: A wafer of P-type conductivity silicon crystal .06 inch by .035 inch by .006 inch thick was uniformly doped with a boron concentration of $10^{16}$ atoms/cc. which provided a resistivity of one ohm centimeter. The wafer was then heated in an atmosphere of phosphorus pentoxide in accordance with the teachings of Patent No. 2,804,405, issued August 27, 1957, to L. Derick and C. J. Frosch to introduce into restricted areas of the wafer an N-type region .0005 inch deep and .002 inch apart. A low resistance contact was connected to each N region in accordance with the teachings of copending application Serial No. 838,954, filed September 9, 1959, for M. M. Atalla and E. E. La Bate, now Patent No. 2,973,466. The wafer was then cleaned in accordance with the teachings of the Atalla patent noted above and oxidized in steam for one hour at 650 degrees centigrade to provide an oxide approximately 5000 angstroms thick. An aluminum contact approximately .002 inch square by 2000 angstroms thick was deposited onto the oxide coating to encompass the extensions of the planes of the PN junctions through the oxide. This was accomplished by evaporation of aluminum from a tungsten filament in an evaporation chamber at a pressure of $10^{-6}$ millimeters of mercury .

In operation 10 volts were applied between the ohmic contacts connected to the N regions of the device. The bias across the oxide coating was 10 volts and the critical voltage $V_c$ was 2 volts. The cut-off frequency was found to be $20\times10^6$ cycles per second.

No effort has been made to exhaust the possible embodiments of the invention. It will be understood that the embodiment described is merely illustrative of the preferred form of the invention and various modifications may be made therein without departing from the scope and spirit of this invention.

For example, although the devices were disclosed in terms of a specific arrangement of conductivity type regions it should be evident that the opposite arrangement would be equally operative.

Additionally, it should be understood that the semiconductor material involved in the devices is not limited to silicon. Some of the compound semiconductor materials such as gallium arsenide also form suitable oxides.

Furthermore, although the devices are illustrated in terms of rectangular semiconductor wafers it is to be understood that devices of other geometries are readily fabricated in accordance with this invention. For example, wafers of cylindrical geometry are readily adapted for operation as described.

What is claimed is:

1. A solid state device comprising a body having a first and a second region in intimate contact along a mutual interface, said first region comprising silicon semiconductor material, said second region comprising a thermally grown oxide of said silicon semiconductor material, said first region including a PN junction, said junction extending inwardly into said first region, means for impressing a voltage to produce an electric field across said second region encompassing said two regions, said means being spatially removed to one side of the extension of the plane of said junction through said second region and means for reverse biasing said PN junction.

2. A solid state device comprising a body having a first and a second region in intimate contact along a mutual interface, said first region comprising a silicon semiconductor wafer having successively therein a first, a second and a third PN junction extending in a substantially parallel arrangement inwardly from said mutual interface, said second region comprising a thermally grown oxide of the silicon semiconductor material, said oxide having a thickness of less than 500 angstroms, means for impressing a voltage to produce an electric field across said PN junctions, said electric field corresponding to a forward bias of said first and third junction and a reverse bias of said second junction, and means for impressing a voltage to produce an electric field across said second region encompassing said two regions, at least part of said means extending along the surface of said second region through the extensions of the planes of said first and second junctions through said second region, said means having a maximum extent short of the extention of the plane of said third junction.

3. A solid state device in accordance with claim 2 wherein said means for impressing a voltage to produce an electric field across said second region comprises at least one metal electrode connected to said oxide coating through the extensions of the planes of said first and second junctions through said second region and a substantially ohmic contact to said first region.

4. A solid state device comprising a first and second region in intimate contact along a mutual interface, said first region comprising a semiconductor wafer, said second region comprising an oxide thermally grown on said first region, said first region including at least one minority carrier source therein, said minority carrier source having associated therewith a space charge region, at least one substantially ohmic contact to each of said first and second regions, and voltage means connected between said contacts for providing a voltage drop across said second region for inducing a charge region at said mutual interface, said charge region being sufficiently close to said minority carrier source to permit interaction therebetween.

5. A solid state device comprising a first and second region in intimate contact along a mutual interface, said first region comprising a semiconductor wafer, said second region comprising an oxide thermally grown on said first region, said first region having at least third and fourth adjoining conductivity type regions therein for forming at least one PN junction therebetween, said PN junction having a space charge region associated therewith, at least one substantially ohmic contact to each of said first and second regions, and voltage means connected between said contacts for providing a voltage drop across said second region for inducing a charge region at said mutual interface, said charge region being sufficiently close to said space charge region to permit interaction therebetween.

6. A combination in accordance with claim 5 wherein said second region is less than 500 angstrom units thick.

References Cited by the Examiner

UNITED STATES PATENTS

| | | | |
|---|---|---|---|
| 2,900,531 | 8/59 | Wallmark | 307—88.5 |
| 2,918,628 | 12/59 | Stuetzer | 330—39 |
| 2,991,371 | 7/61 | Lehovec | 307—88 |
| 3,056,888 | 10/62 | Atalla | 307—88.5 |
| 3,064,167 | 11/62 | Hoerni | 317—240 |
| 3,074,804 | 1/63 | Planer et al. | 317—237 |
| 3,102,230 | 8/63 | Kahng | 323—94 |

LLOYD McCOLLUM, *Primary Examiner.*

MILTON O. HIRSHFIELD, *Examiner.*